United States Patent
Bour et al.

(10) Patent No.: US 6,345,063 B1
(45) Date of Patent: Feb. 5, 2002

(54) ALGAINN ELOG LED AND LASER DIODE STRUCTURES FOR PURE BLUE OR GREEN EMISSION

(75) Inventors: David P. Bour, Cupertino; Linda T. Romano; Michael A. Kneissl, both of Sunnyvale, all of CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/363,251

(22) Filed: Jul. 28, 1999

Related U.S. Application Data

(63) Continuation-in-part of application No. 09/127,038, filed on Jul. 31, 1998.

(51) Int. Cl.[7] .......................... H01S 3/19; H01L 29/06; H04J 14/02
(52) U.S. Cl. ............... 372/45; 372/43; 372/44; 372/50; 257/14; 359/134; 359/344
(58) Field of Search .................. 372/43, 44, 45, 372/46, 50; 257/14, 15, 94, 103; 359/127, 134, 333, 344, 345

(56) References Cited

U.S. PATENT DOCUMENTS

| | | | | |
|---|---|---|---|---|
| 5,777,350 A | * | 7/1998 | Nakamura et al. | 257/96 |
| 5,889,806 A | * | 3/1999 | Nagai et al. | 372/45 |
| 5,923,690 A | * | 7/1999 | Kume et al. | 372/45 |
| 5,932,896 A | * | 8/1999 | Sugiura et al. | 257/94 |
| 5,903,017 A | * | 5/2000 | Itaya et al. | 257/190 |
| 6,121,639 A | * | 9/2000 | Van de Walle | 257/103 |
| 5,987,048 A | * | 11/2000 | Ishikawa et al. | 372/46 |

OTHER PUBLICATIONS

N. Dietz et al., Native Defect Related Optical Properties of $ZnGeP_2$, Applied Physics Letters, vol. 65, No. 22, Nov. 28, 1994, pp. 2759–2761.

S. Nakamura, First Successful III–V Nitride Based Laser Diodes, International Symposium on Blue Laser and Light Emitting Diodes, Chiba University, Japan, Mar. 5–7, 1996, pp. 119–124.

S. Nakamura, First III–V–Nitride–Based Violet Laser Diodes, Journal of Crystal Growth 170, 1997, pp. 11–15.

F. A. Ponce et al., Nitride–Based Semiconductors for Blue and Green Light–Emitting Devices, Nature, vol. 386, Mar. 27, 1997, pp. 351–358.

G. C. Xing et al., Substrate Effects on the Epitaxial Growth of $ZnGeP_2$ Thin Films by Open Tube Organometallic Chemical Vapor Disposition, J. Appl. Phys., vol. 69, No. 8, Apr. 15, 1991, pp. 4286–4291.

* cited by examiner

*Primary Examiner*—Brian Healy

(57) ABSTRACT

Group III–V nitride semiconductors are used as optoelectronic light emitters. The semiconductor alloy InGaN is used as the active region in nitride laser diodes and LEDs, as its bandgap energy can be tuned by adjusting the alloy composition, to span the entire visible spectrum. InGaN layers of high-indium content, as required for blue or green emission are difficult to grow, however, because the poor lattice mismatch between GaN and InGaN causes alloy segregation. In this situation, the inhomogeneous alloy composition results in spectrally impure emission, and diminished optical gain. To suppress segregation, the high-indium-content InGaN active region may be deposited over a thick InGaN layer, substituted for the more typical GaN. First depositing a thick InGaN layer establishes a larger lattice parameter than that of GaN. Consequently, a high indium content heterostructure active region grown over the thick InGaN layer experiences significantly less lattice mismatch compared to GaN. Therefore, it is less likely to suffer structural degradation due to alloy segregation. Thus, the thick GaN structure enables the growth of a high indium content active region with improved structural and optoelectronic properties, leading to LEDs with spectrally pure emission, and lower threshold laser diodes.

17 Claims, 8 Drawing Sheets

ALGAINN ELOG LED AND LASER DIODE STRUCTURES FOR PURE BLUE OR GREEN EMISSION

This is a continuing application from, and claims the benefit of the filing date of, U.S. patent application Ser. No. 09/127,038, filed Jul. 31, 1998 pending.

BACKGROUND OF THE INVENTION

1. Field of Invention

The invention relates to the field of semiconductors. More particularly, the invention is directed to group III–V nitride semiconductor films usable in blue light emitting devices.

2. Description of Related Art

The light-emitting diode is the basic component for electronic lighting technology. A light-emitting diode is a relatively simple semiconductor device which emits light when an electric current passes through a p-n junction of the light-emitting diode. As shown in FIG. 1, a light-emitting diode 100 includes a p-type 110 semiconductor material adjacent to an n-type 120 semiconductor material, i.e., a p-n junction, characterized by a bandgap energy $E_g$ 130. The bandgap energy 130 is the minimum energy required to excite an electron 160 from a valence band 140 to a conduction band 150, where the electron 160 becomes mobile. Likewise, the bandgap energy 130 also determines the energy of a photon produced when the electron 160 in the conduction band, i.e., a conduction electron, recombines with a hole 170, i.e., an unoccupied electronic state, in the valence band 140. When forward current passes through the diode 100, the electrons 160 in the conduction band 150 flow across the junction from the n-type material 120, while the holes 170 from the valence band 140 flow from the p-type material 120. As a result, a significant number of the electrons 160 and the holes 170 recombine in the p-n junction, emitting light with an energy $E_{photon}=E_g$. These semiconductor devices, comprising a p-n junction, in a single material, and are referred to as homojunction diodes.

In order to obtain more efficient LEDs and laser diodes, in particular, lasers that operate at room temperature, it is necessary to use multiple layers in the semiconductor structure. These devices are called heterojunction or heterostructure LEDs or lasers.

The wavelength, and thus the color of light emitted by an LED or laser diode, depends on the bandgap energy Eg. LEDs or laser diodes that emit light in the red-to-yellow spectrum have been available since the 1970's. There has been great difficulty, however, in developing efficient LEDs that emit light at shorter wavelengths. Extending LED light sources into the short-wavelength region of the spectrum, the region extending from green to violet, is desirable because LEDs can then be used to produce light in all three primary colors, i.e., red, green, and blue. Shorter-wavelength laser diodes will likewise enable full-color projection displays; and they will also permit the projection of coherent radiation to focus laser light into smaller spots. That is, in the optical diffraction limit, the size of the focused spot is proportional to the wavelength of the light. Reducing the wavelength of the emitted light allows optical information to be stored at higher densities and read out more rapidly.

FIG. 2 shows a conventional LED structure 200 in which an InGaN active layer 230 is formed over a group II–V nitride layer 220. Specifically, as shown in FIG. 2, the conventional LED 200 includes a substrate 205, which may, for example, be formed of sapphire or silicon carbide. A buffer layer 210 is formed on the substrate 205. The group III–V nitride layer 220 is then formed on the buffer layer 210. The group III–V nitride layer 220 is typically GaN. The InGaN active layer 230 is formed on the group III–V nitride layer 220. A second group III–V nitride layer 240 is then formed on the InGaN active layer 230. A third group III–V nitride layer 250 is formed on the second group V layer 240. The first group III–V nitride layer 220 is n-type doped. The second and third group III–V nitride layers 240 and 250 are p-type doped. A p-electrode 260 is formed on the third group III–V nitride layer 250. An n-electrode 270 is formed on the first group III–V nitride layer 220.

SUMMARY OF THE INVENTION

This invention provides group III–V nitride films formed on substrates usable to form short-wavelength visible light-emitting optoelectronic devices, including light-emitting diodes (LEDs) and diode lasers.

This invention provides a method for growing light-emitting device heterostructures over a thick InGaN layer that provides a suitable bandgap for blue, green, or even red light emission.

The invention provides a stable InGaN structure that avoids lattice mismatch.

The invention provides other electronic devices, such as transistors, which can incorporate InGaN with other group III–V semiconductors.

Group III–V nitrides include elements from groups III, i.e., gallium, indium, and aluminum, and V, i.e., nitrogen, of the periodic table. These materials are deposited over substrates forming layered structures for optoelectronic devices, including LEDs and laser diodes. The resulting devices can emit visible light over a wide range of wavelengths.

The performance of the optoelectronic devices depends on the quality of the group III–V nitride films formed over the substrates. An important structural characteristic of the group III–V nitride films, which effects their emission quality, is lattice matching between each of the layers. In particular, lattice mismatch occurring between dissimilar materials may produce crystal defects, such as dislocations, cracks, or alloy inhomogeneity, which degrade the optoelectronic quality of the material.

The group III–V nitride semiconductors, GaN, AlN and InN, are used in visible light emitters because these materials are characterized by a wide bandgap energy, as is necessary for short-wavelength visible light emission. Group III–V nitrides also form strong chemical bonds, which make the material very stable and resistant to degradation under high electrical current densities and intense light illumination.

Most optoelectronic devices based on the group III–V nitride compounds require growth of a sequence of layers with different bandgap energies and refractive indices. The bandgap energy of the active layer determines the wavelength of light emitted from a light-emitting diode or laser. In addition, the energy band and refractive index discontinuities between layers of different composition provides for optical and carrier confinement. To obtain layers with the bandgap around 2.7 eV, which will produce light in the blue region of the spectrum, InGaN alloys can be used. The bandgap energy of GaN is 3.4 eV, while the bandgap energy of InN is 1.9 eV. Therefore, $In_xGa_{1-x}N$ alloys span the visible spectrum, in which case an estimated In composition x of about 30%, i.e., $In_{0.3}Ga_{0.7}N$, is required to obtain blue-light emission, 50% for green emission, and 100%, i.e., InN, for red emission.

Growing InGaN alloys with such a high In content on GaN has heretofore been, if not impossible, difficult using conventional techniques, such as metal-organic chemical vapor deposition (MOCVD). Specifically, when using these conventional techniques, the InGaN alloy active region tends to segregate. As the indium content is increased to produce longer-wavelength emission, the InGaN alloy becomes unstable. As a result of this instability, the InGaN alloy separates, or segregates, into In-rich regions and Ga-rich regions, so that the InGaN alloy composition, and therefore the active region bandgap energy, is no longer uniform.

This inhomogeneous composition causes the electroluminescence (EL) to be spectrally broad, i.e., where a broad range of wavelengths is emitted. For instance, while the spectral emission widths of violet LEDs (390–420 nm.), corresponding to 10–20% In content, may be as narrow as 10–15 nm, the spectral emission width increases to 20–30 nm for blue LEDs (430–470 nm.), corresponding to a ~30% In content, and 40–50 nm for green LEDs (500–530 nm.), corresponding to a ~50% In content.

The poor spectral purity of green LEDs limits their application in full-color displays, where pure colors are needed to generate, by additive mixing, a broader palette of colors. Likewise, such broad spectral emission widths also translate into a broad gain spectrum for laser diode structures. When the gain spectrum becomes broad, the peak gain is reduced, so that it becomes difficult to reach the laser oscillation threshold. For this reason, when formed using these conventional techniques, the performance of blue and green group III–V nitride laser diodes is poor compared to violet-emitting group III–V laser diode devices. Indeed, a true blue nitride laser has not yet been demonstrated; and green nitride laser diodes present even greater difficulty, due to their requisite higher In content.

In order to improve the spectral purity of blue and green LEDs, and to promote the development of true blue or green group III–V nitride laser diodes, the growth of high-indium-content InGaN alloys, with homogeneous alloy content, is necessary. The alloy segregation problems must be overcome, so that the alloy content remains uniform, even when the indium content approaches 50%. Presently, alloy segregation limits the In content of nitride lasers to values less than 20%, corresponding to violet and near-ultraviolet emission. While this short wavelength is ideal for optical storage, longer wavelengths, i.e., blue-green-red, are required for applications such as projection displays and undersea communication.

Because the bandgap of GaN is 3.4 eV and the bandgap of InN is 1.9 eV, a group III–V alloy with an In composition of about 30% is required in order to obtain the blue light emission in the conventional LED structure 200 described above. However, GaN and InN have a very large lattice mismatch, which may induce phase separation of InGaN alloys of high In content. Thus, it has heretofore been very difficult to form an InGaN alloy having an In content higher than 20%, where excellent optoelectronic quality is preserved, using conventional growth techniques. Thus, constructing effective pure blue, green, or red light emitting structures using InGaN grown over group III–V nitride layers has proven very difficult.

The inventors have determined that these problems may be caused by the lattice mismatch of over 10% between GaN and InN, which can cause alloy segregation. Thus, $In_xGa_{1-x}N$ alloys with homogeneous alloy content x higher than 20% have been difficult to achieve using the conventional techniques, such as MOCVD.

Thus, it would be advantageous to integrate InGaN with other group III–V nitrides, in a manner which avoids the problems of the conventional structures described above.

This invention thus provides a novel semiconductor structure that incorporates a thick InGaN layer. In the modified layer structure according to the invention, a thick InGaN layer replaces the thick GaN layer, which is normally incorporated into the device structure, as both a dislocation filter and a lateral n-contact layer. Depositing a thick InGaN layer establishes a larger lattice parameter compared to the typical GaN template which is employed for overgrowth of the device heterostructure. Consequently, a high-indium-content heterostructure active region grown over the thick InGaN layer experiences less mismatch strain compared to the high-indium-content heterostructure conventionally grown over GaN. Therefore, the device is less likely to suffer structural degradation due to alloy segregation. In this manner, a thick InGaN structure enables the growth of high-indium-content active regions with improved structural and optoelectronic properties. By overcoming the obstacles associated with the InGaN alloy segregation, the compositional uniformity of InGaN layers is improved, so that the spectral emission of blue, green, and even red LEDs becomes more pure. Similarly, the gain spectra of visible nitride laser diodes is also sharper, so that the peak gain is greater, for low threshold. A further benefit of the thick InGaN layer is its superior function as a lateral contact layer. This is a consequence of InGaN's lower bandgap energy, which contributes to a lower contact resistance, and to higher electron mobility and concentration.

Co-pending U.S. application Ser. No. 09/137,112 filed herewith, is herein incorporated by reference in its entireties.

These and other features and advantages of invention are described in or are apparent from the following detailed description of the preferred embodiments.

BRIEF DESCRIPTION OF THE DRAWINGS

The preferred embodiments of the invention will be described in detail, with reference to the following figures in which.

DETAILED DESCRIPTION OF PREFERRED EMBODIMENTS

Figure 3:
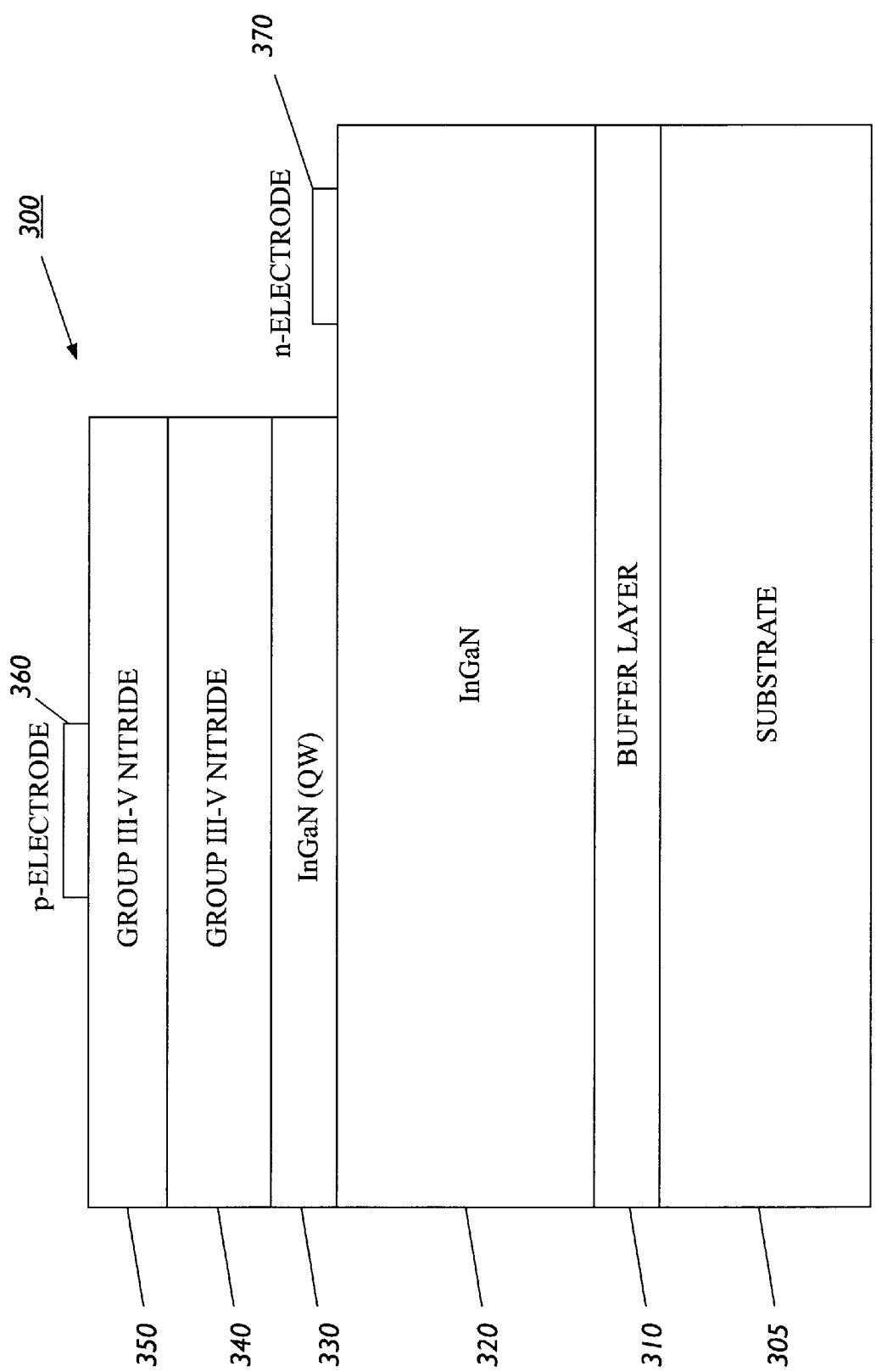
FIG. 3 shows the structure of an LED according to an embodiment of the invention.

FIG. 3 shows a multi-layer LED structure 300 according to an embodiment of this invention. Specifically, FIG. 3 shows an LED heterostructure grown over a thick InGaN layer, which permits the realization of an unsegregated, high-indium-content InGaN alloy active region for brighter, and more spectrally pure, emission of light. As shown in FIG. 3, the LED 300 includes a single-crystal substrate 305, which may be formed by any known or later developed substrate material, such as, for example, sapphire, silicon carbide or spinel. In the case of sapphire, A and C-oriented single crystal sapphire is preferable for optoelectronic devices. The substrate 305 is typically several hundred microns thick, i.e., 100–500 m thick.

A buffer layer 310, also known as a nucleation layer, is formed over the substrate 305. The buffer layer 310 serves primarily as a wetting layer, to promote smooth, uniform coverage of the sapphire substrate. The buffer layer 310 is typically formed of either GaN, InGaN, AlN or AlGaN. The buffer layer 310 typically has a thickness of about 100–500 Å. The buffer layer 310 should have a lattice orientation that is substantially aligned to that of the substrate. The buffer layer 310 is typically deposited as a thin amorphous layer. The buffer layer 310 is typically deposited at a low temperature, then crystallized through a solid-phase epitaxy process, usually coincident with the temperature being raised for the remainder of the structure. However, any known or later developed method for forming the described buffer layer 310 can be used.

Figure 4:
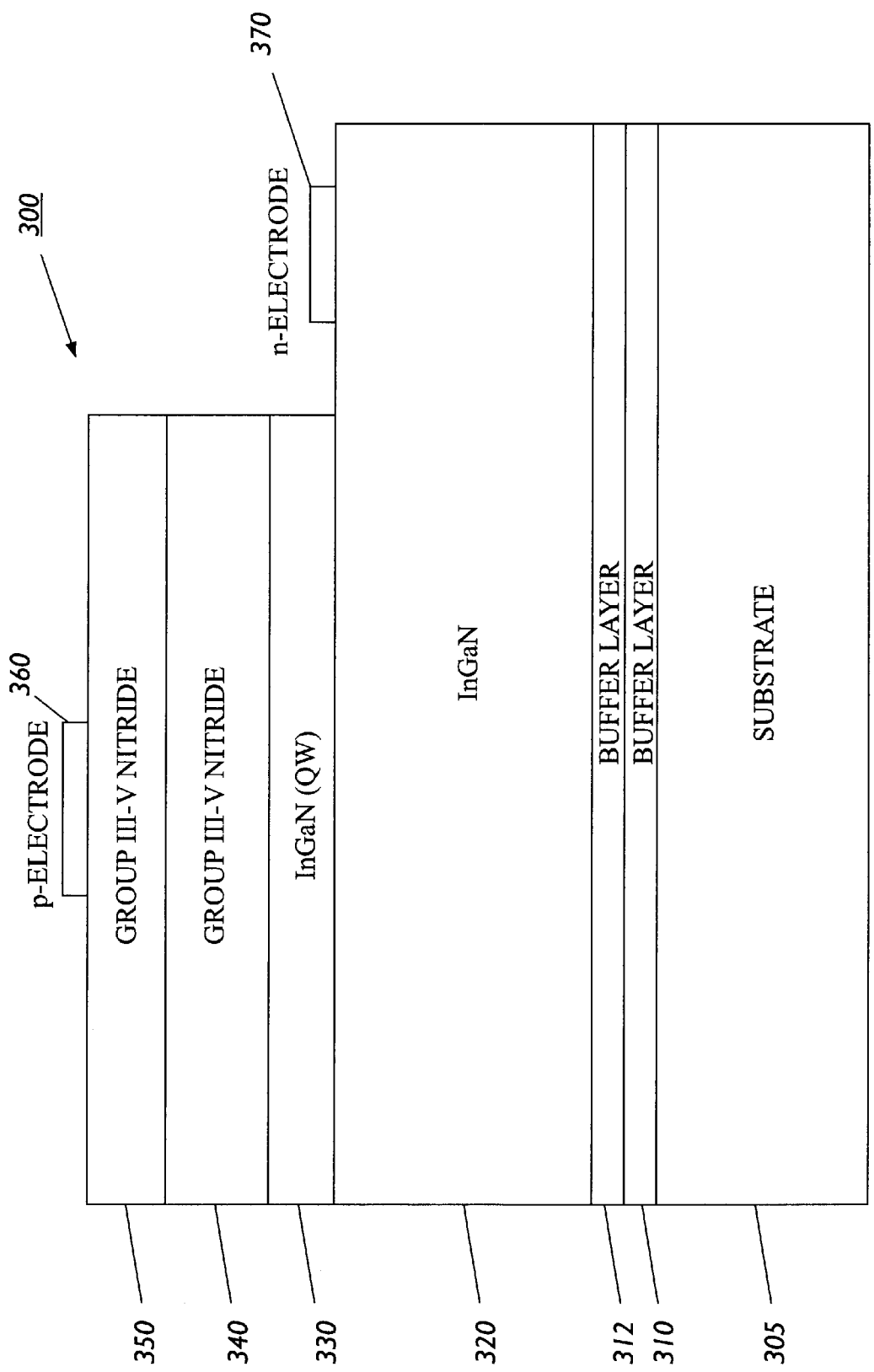
FIG. 4 shows the LED structure of FIG. 3 according to another embodiment of the invention.

The buffer layer 310 may also be formed as a plurality of layers. For example, FIG. 4 shows the LED structure 300 of FIG. 3 with a second buffer layer 312. The two buffer layers 310 and 312 can have different alloy concentrations or be deposited under different conditions to promote smooth film growth and to accommodate the large lattice mismatch. The remaining layers 305, 320, 330 and 340 are identical to the layers formed in FIG. 3.

Figure 7:
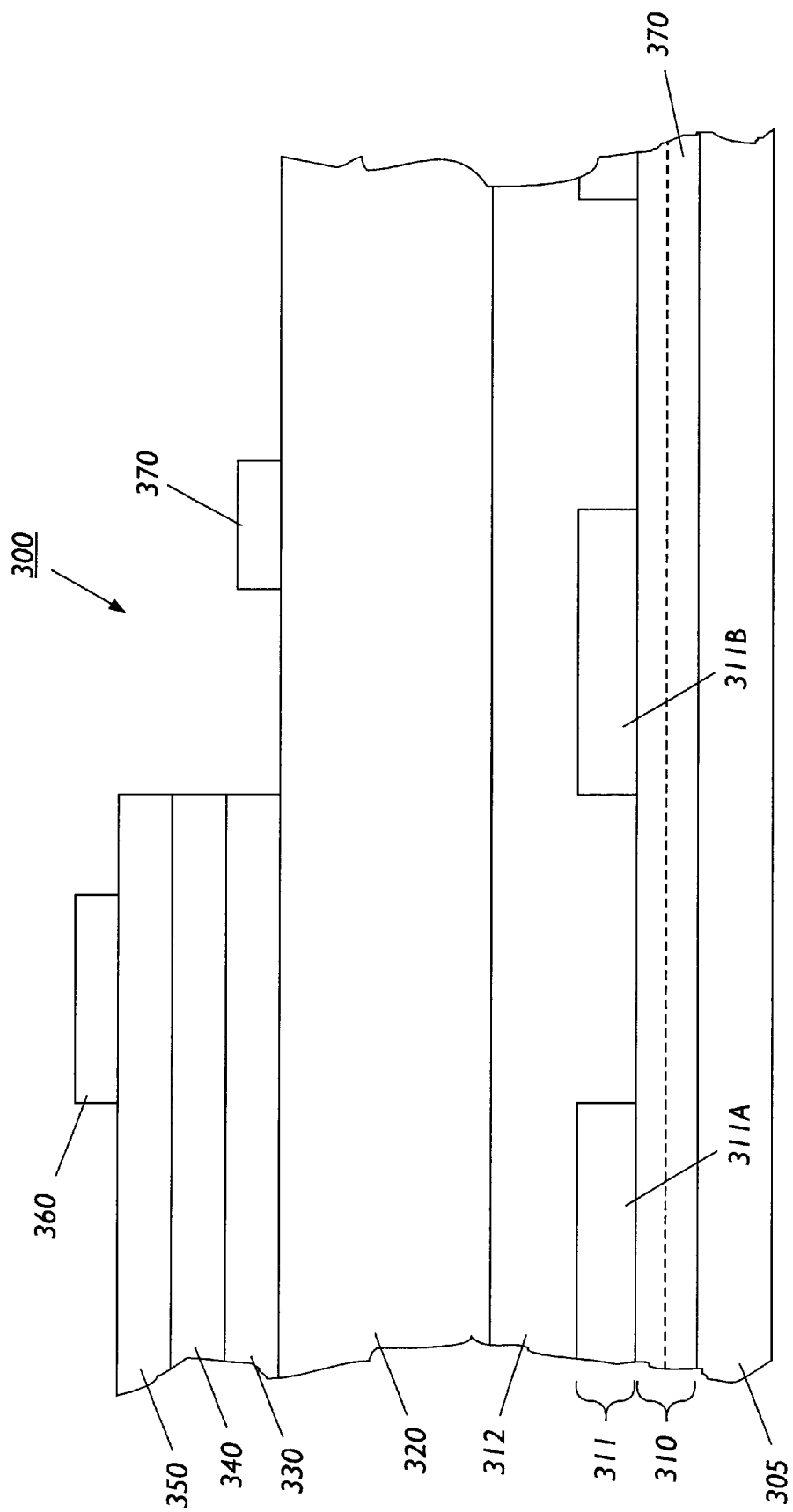
FIG. 7 shows an LED structure according to yet another embodiment of the present invention.

Alternatively, one or more additional layers, for example for the purpose of reducing dislocations formed in subsequent layers, may be formed under, between, and/or upon buffer layers 310 and/or 312. Each such additional layer, referred to herein as a patterned mask layer, may be formed of silicon nitride (SiN), silicon dioxide (SiO2), or similar material a refractory metal or alloy thereof, or other material that does not nucleate growth of GaN at high temperatures. As shown in FIG. 7, which illustrates one such embodiment, a patterned mask layer 311 is formed atop buffer layer 310.

This patterned mask layer is patterned, for example into stripes 311a, 311b, etc., to allow selective subsequent growth which will extend both vertically and laterally to cover buffer layer 310 and masking layer 311. The growth process employed is referred to as epitaxial lateral growth (ELOG), and for this reason buffer layer 312 is also referred to as an ELOG layer. For additional details on the ELOG process, see D. Kapolnek et al., "Anisotropic epitaxial lateral growth inGaN selective area epitaxy", Appl. Phys. Lett. Vol. 71, p. 1204 (1997), which is hereby incorporated by reference. The region above the stripes 311a, 311b, etc. will present reduced dislocation defects for devices located above the stripes. In this embodiment, buffer layer 310 may be, for example, a GaN or InGaN layer, and may further include a sublayer 309 of GaN or InGaN formed at relatively lower temperature than of layer 310, as mentioned to above.

Figure 8:
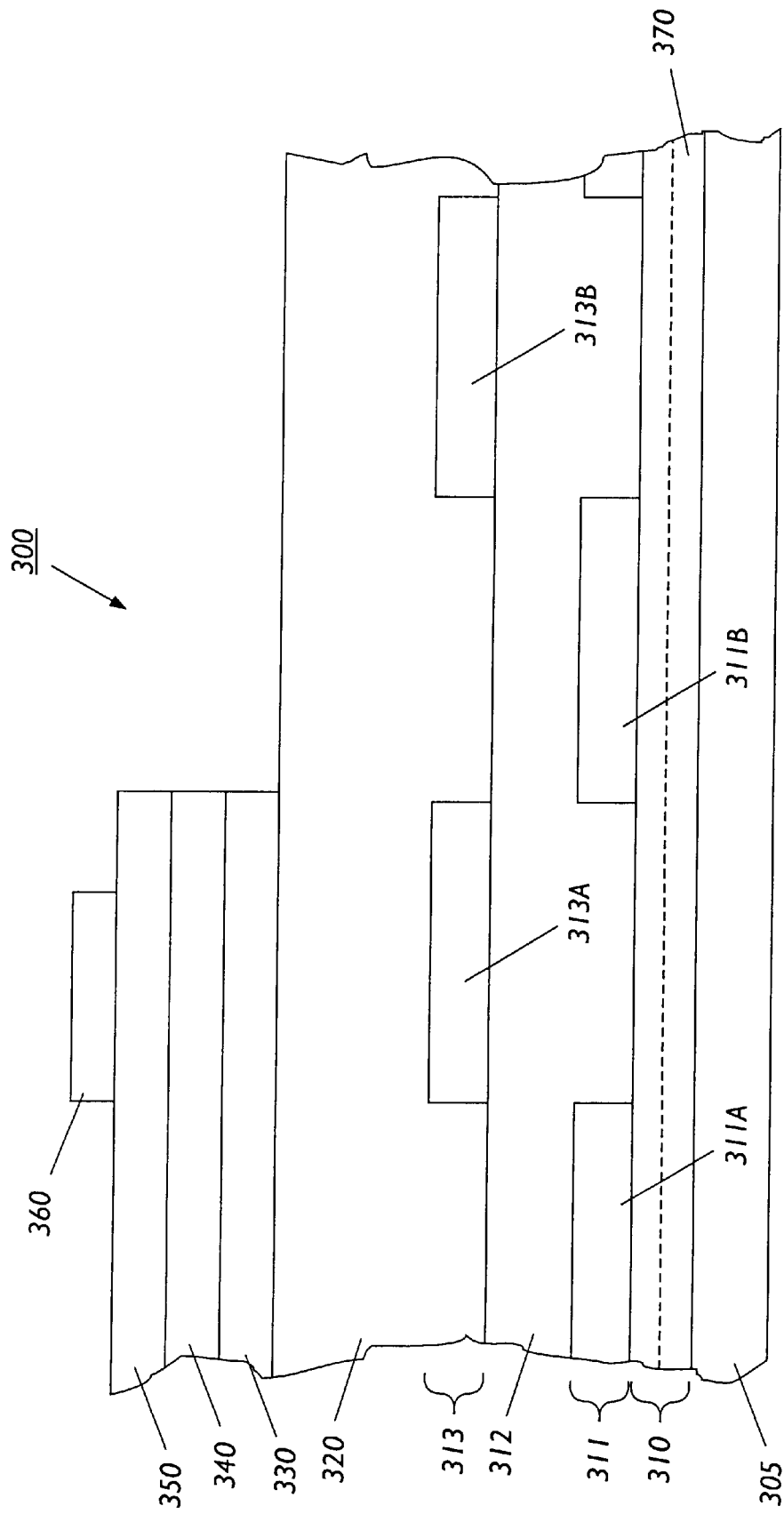
FIG. 8 show an LED structure according to still another embodiment of the present invention.

As shown in FIG. 8, which illustrates still another such embodiment, another patterned mask layer 313 is formed atop buffer (ELOG) layer 312. Patterned mask layer 313 is also patterned into stripes 313a, 313b, etc., such stripes being located over the regions between stripes 311a, 311b, etc. In this way, stripes 313a, 313b, etc. block vertical migration of dislocation defects, presenting a nearly defect-free surface onto which one or more layers may be subsequently deposited. The effect of reduced dislocations in this InGaN ELOG layer would eliminate upper surface pit formation that arises at the dislocations thereby providing a planar structure for device overgrowth. In this embodiment, buffer layer 310 may be, for example, a GaN or InGaN layer, and may further include a sublayer 309 of GaN or InGaN formed at relatively lower temperature than that of layer 310, as mentioned to above.

A thick InGaN layer 320 is then deposited over the buffer layer 310 (or buffer layer 312). The thick InGaN layer 320 is n-type doped and is typically grown to a thickness between 0.5 $\mu$m and 100 $\mu$m. An InGaN active layer 330 is then deposited over the thick InGaN layer 320. The InGaN active layer 330 can be used to form blue, green, and even yellow or red LEDs. The InGaN active layer 330 is typically about 10–100 Å thick. While relatively unsegregated InGaN films with an indium content of up to about 20% can be grown over thick GaN, the indium content is extendible to, for example, 50% by growing the InGaN film over a thick InGaN layer of approximately 30% indium, because this represents a similar magnitude of lattice mismatch. The InGaN active layer 330 is thus a high indium content heterostructure active region which experiences less lattice mismatch strain than compared to an InGaN film grown directly over GaN. By reducing the lattice mismatch, InGaN alloy phase separation is minimized, thus preserving the optoelectronic quality of the active region material, which is most critical.

A first group III–V nitride layer 340 is then formed over the InGaN active layer 330. A second group III–V nitride layer 350 is formed over the first group III–V nitride layer 340. The first group III–V nitride layer 340 and the second group III–V nitride layer 350 are p-type doped. Typical group III–V nitrides used for these layers include GaN, InGaN, AlGaN or AlInGaN; and the first group III–V nitride layer 340 typically has a higher bandgap energy than the second group III–V nitride layer 350, so as to better confine injected electrons to the active region. A pelectrode 360 is formed over the second group III–V nitride layer 350. The second group III–V nitride layer 350 serves as a contact layer, and so is preferably highly p-type doped, and of lower bandgap energy, corresponding to a lower Schottky barrier at its interface with the metal electrode 360.

An n-electrode 370 is formed over the thick InGaN layer 320. All of the layers 310, 320, 330, 340 and 350 described above may be formed by any conventional or later developed technique, such as, for example, molecular beam epitaxy, hydride vapor phase epitaxy or MOCVD.

As is known in the art, multiple confinement and contact layers can be provided within the LED structure 300. The first and second group III–V nitride layers 340 and 350 are illustrative and are not meant to limit the number of group III–V layers which may be formed within the LED structure.

In operation, a positive (forward) bias is applied between the p-electrode 360 and the n-electrode 370. Electrons in the conduction band flow from the n-doped thick InGaN layer 320 to a lower energy state in the InGaN active layer 330. Current applied at the p-electrode 360 causes holes in the valance band of the first and second group III–V nitride layers 350 and 340 to flow into the InGaN active layer 330. Thus, electrons from the n-doped InGaN layer 320 combine with holes from the p-doped group III–V nitride layers 340 and 350 in the InGaN active layer 330. Recombination of holes and electrons in the active layer 330 results in the emission of light, with photon energy equal to the InGaN active region's bandgap energy. In this case, when the active region has a bandgap of about 2.7 eV, light in the blue region of the spectrum is emitted. An active region of higher indium content would produce longer wavelength (green-red) emission. The thick InGaN layer 320 and the group III–V nitride layers 340 and 350 act as confinement layers, shepherding the electrons and holes into the lower energy InGaN active layer 330, maximizing the number of electrons and holes which recombine in the active region 330. Light is emitted in all directions.

Figure 1:
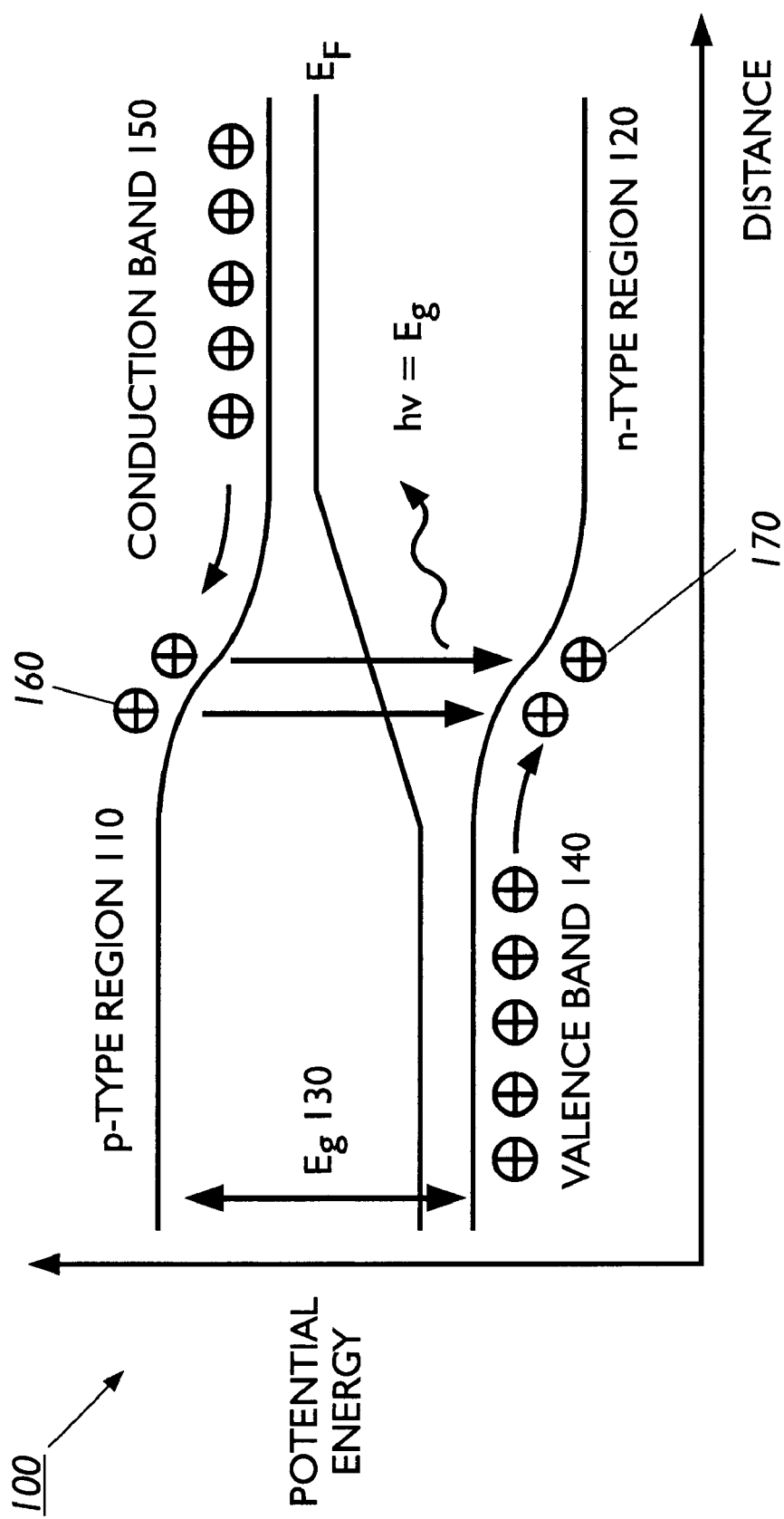
FIG. 1 shows a conventional p-n junction device.
Figure 2:
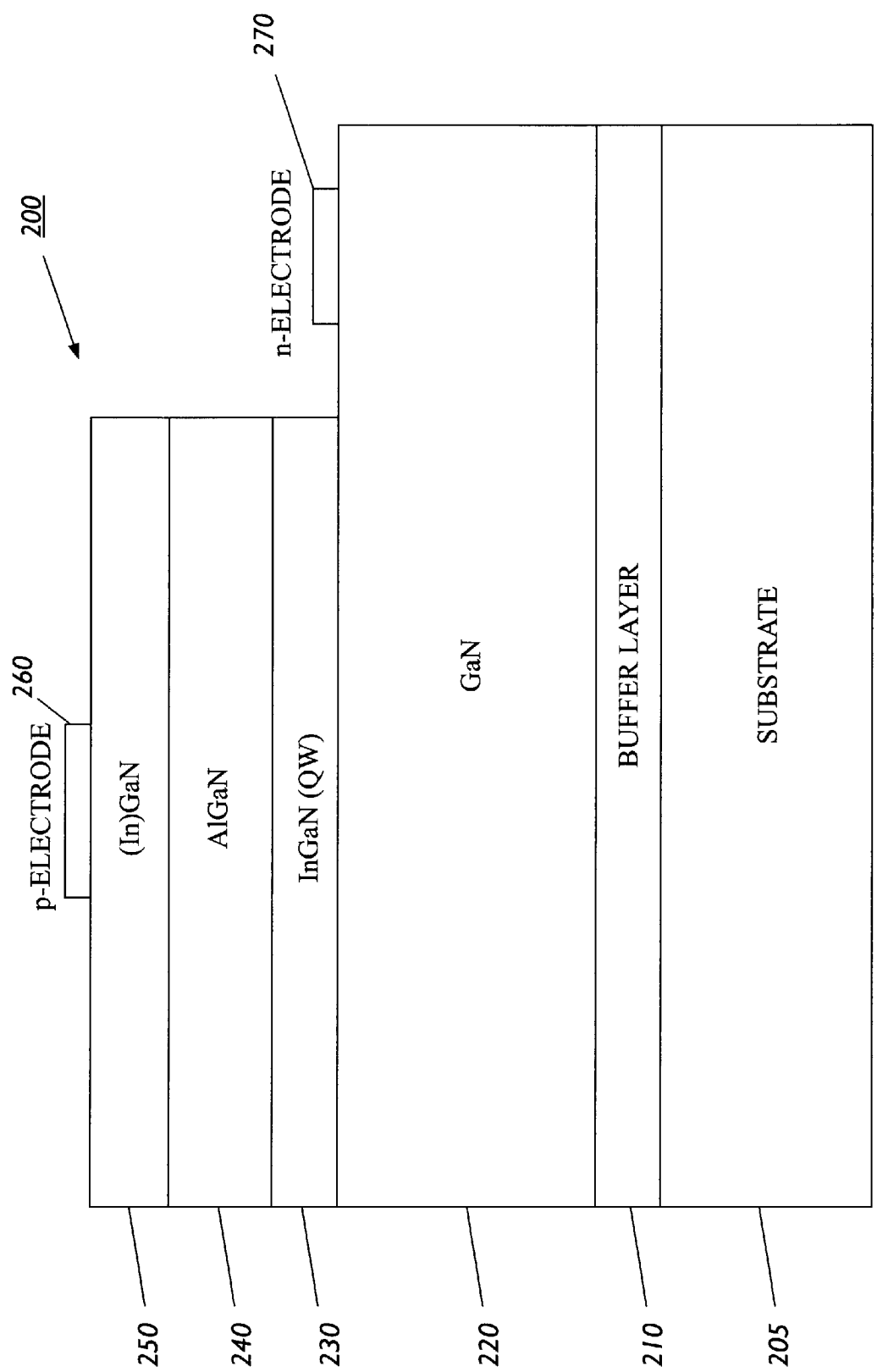
FIG. 2 shows the structure of a conventional LED.
Figure 5:
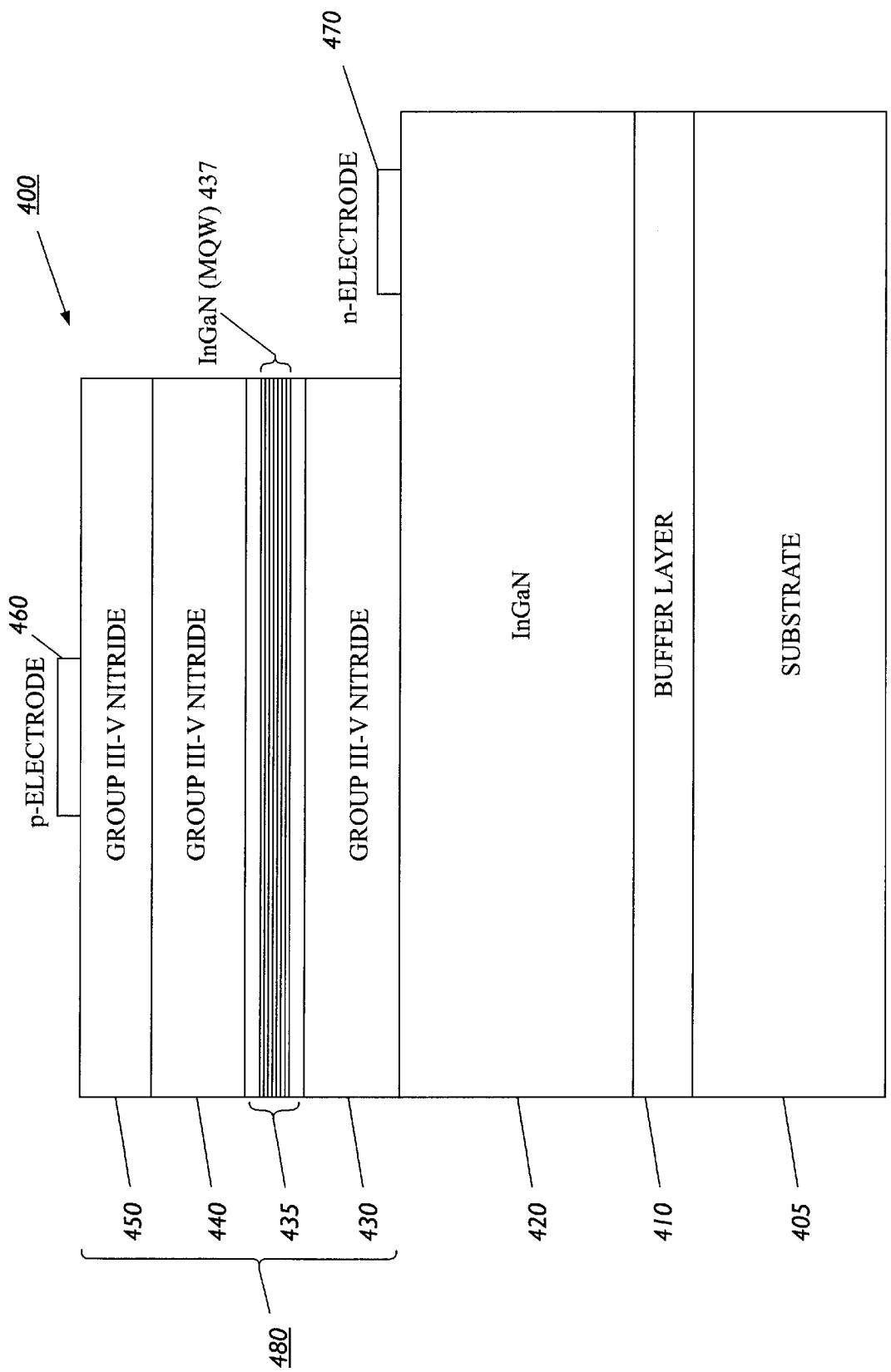
FIG. 5 shows the structure of a diode laser according to another embodiment of the invention.

FIG. 5 shows a laser diode structure 400 according to another embodiment of the invention. In this embodiment, a thick InGaN layer 420 is formed instead of the conventional GaN layer 220 shown in FIG. 2. This, establishes a template of larger lattice parameter, for overgrowth of the laser heterostructure; and thereby permits the realization of a compositionally homogeneous, high-indium-content InGaN alloy active region, thus producing bright and spectrally pure light emission. The entire laser diode heterostructure 480 is grown over the thick InGaN layer 420.

The laser diode 400 includes a substrate 405, which may be formed by any known or later developed substrate material, such as, for example, sapphire, silicon carbide or spinel. The substrate is typically about 100 to 500 m thick.

A buffer layer 410 is formed over the substrate 400. The buffer layer 410 serves primarily as a wetting layer and promotes smooth and uniform coverage of the sapphire substrate 405. The buffer layer 410, also known as a nucleation layer, is typically formed of either GaN, InGaN, AlN or AlGaN. The buffer layer 410 has, typically, a thickness of about 100 to 500 Å thick. The buffer layer 410 should have a lattice orientation that is substantially aligned to that of the sapphire substrate 405. The buffer layer 410 is typically deposited as a thin amorphous layer. The buffer layer 410 is typically deposited at a low temperature, then crystallized through a solid phase epitaxy process. However, any known or later developed method for forming the deposited buffer layer 410 can be used.

The buffer layer 410 may also be formed as a plurality of layers. For example, multiple buffer layers may be incrementally formed over the substrate 400. The two or more buffer layers can have different alloy concentrations or be deposited under different conditions to promote smooth film growth and to accommodate the large lattice mismatch. For improved reduction of defects due to lattice mismatch, one or more patterned mask layers (not shown), may be formed under, between, and/or upon the one or plurality of buffer layers 410, as described above with regard to the embodiment shown in FIGS. 7 and 8.

A thick InGaN layer 420 is then formed over the buffer layer 410. The thick InGaN layer 420 is n-type doped and is typically about 0.5 $\mu$m to 100 $\mu$m thick. After the thick InGaN layer 420 is formed, the device heterostructure is formed. In forming the device heterostructure according to this invention, an n-type cladding layer is first formed. The n-cladding layer is a first group III–V nitride layer 430 formed over the thick InGaN layer 420. The first group III–V nitride layer 430 is n-type doped and is about 0.2 to 2 $\mu$m thick. A composite InGaN active layer and waveguide 435 are then formed over the InGaN layer 430. The overall thickness of this composite waveguide is 0.05–0.4 $\mu$m. Contained within the waveguide is an InGaN quantum well active region 437, comprised of quantum wells which are typically about 10 to 100 Å thick. The InGaN active region 437 may have a single well structure or a multiple well structure. Thus, the active layer 435 acts as a waveguide and includes with its structure the active region 437. Gain, which results in the emission of light, is generated within the active region 437.

A second group III–V nitride layer 440 is formed over the InGaN active layer 435. A third group III–V nitride layer 450 is formed over the second group III–V nitride layer 440. Both the second and third group III–V nitride layers 440 and 450 are p-type doped. The second group-III nitride layer 440 serves as a p-type cladding layer, and is typically about 0.2 $\mu$m to 2 $\mu$m thick. The third group III–V nitride layer 450 facilitates the formation of a minimum-resistance metal electrode, to contact the p-side of the heterostructure; its thickness is typically 0.01 $\mu$m–2 $\mu$m. The first, second and third group III–V nitride layers 430, 440 and 450 each may be formed of GaN, AlGaN, InGaN and/or AlInGaN.

A p-electrode 460 is formed over the third group III–V nitride layer 450 and an n-electrode 470 is formed over the thick InGaN layer 420. The group III–V nitride layers 440 and 430 all serve as layers for optical and electrical confinement. These materials are characterized by a higher bandgap energy and lower refractive index, compared with the thick InGaN active layer 435. All of the layers 410, 420, 430, 435, 437, 440 and 450 described above may be formed by any conventional or later developed technique, such as, for example, molecular beam epitaxy, hydride vapor phase epitaxy or MOCVD.

As is know in the art, multiple confinement and contact layers can be provided within the laser diode structure 400. Thus, the first, second and third group III–V nitride layers 430, 440 and 450 are illustrative and are not meant to limit the number of group III–V layers which may be formed within the laser diode structure 400.

In operation, a positive (forward) bias is applied between the p-electrode 460 and the n-electrode 470. Electrons in the conduction band flow from the n-doped layers 420 and 430 to a lower energy state in the InGaN active region 437. Holes in the valance band of the group III–V nitride layers 450 and 440 flow from the p-doped layers 450 and 440 into the InGaN active layer 437. Recombination of holes and electrons in the active layer 435 causes the emission of light. In the case of a blue laser, the InGaN active layer 435 has a bandgap energy of about 2.7 eV, so that light in the blue region of the spectrum, i.e., $\lambda \sim 470$ nm, is emitted. To date, for heterostructures grown over thick GaN layers, such a long wavelength has been impossible to achieve, due to the alloy segregation of the InGaN active region.

The light-emitting diode 300 and laser diode 400 described above are appropriate for long-wavelength operation. Thus, the other layers which comprise this heterostructure may be different from those used for conventional shorter-wavelength structures grown on a thick GaN layer, as described above. For example, in the conventional structure, AlGaN alloys of 5–20% Al are required in order to confine injected carriers and to create a transverse waveguide. The requirement for AlGaN layers in the conventional structures creates a serious problem because of cracking and also because of the difficulty associated with p-type doping (where the acceptor activation energy increases with Al content).

In contrast, the longer wavelength, high-indium-content active region structures according to this invention do not require the high bandgap and low index of AlGaN alloys for optical and carrier confinement. Instead, low-aluminum-content AlGaN, GaN or even InGaN offer sufficient confinement. Thus, at longer wavelengths, the entire heterostructure can use lower bandgap alloys than the conventional structure 200 shown in FIG. 2. These lower bandgap alloys are also beneficial with respect to ease of p-doping, and ohmic content formation.

There is substantial experimental evidence that the approach described above of reducing the lattice mismatch can improve the quality of high-indium-content InGaN. For example, "The Composition Pulling Effect of MOVPE Grown InGaN on GaN and AlGaN and its TEM Characterization," by K. Hiramatsu et al. MRS Internet Journal of Nitride Research 2, article 6 (1997) (Hiramatsu), herein incorporated by reference, suggests that structural qualities of InGaN layers are strongly dependent upon the surface the InGaN layers that it was epitaxally deposited onto. For instance, Hiramatsu discloses that when InGaN was grown on thick GaN or AlGaN layers, the InGaN structural quality strongly deteriorated as the layer became thicker or was grown with higher-indium content. In particular, the alloy underwent phase segregation in cases of large lattice strain. This explains the absence of blue and green laser diodes and the poor spectral purity of green LEDs.

More importantly, Hiramatsu suggests that InGaN grown directly on a very thin GaN, AlN or AlGaN buffer (nucleation) layer exhibited superior structural and optoelectronic properties. This suggests that the InGaN segregation is a result of lattice mismatch, and is not a result of a miscibility gap associated with the InGaN alloy. Thus, by establishing an epitaxial template of larger lattice parameter, which is better matched to high-indium-content InGaN alloys, phase segregation can be avoided.

Consequently, it is possible to grow high-quality, high-indium content InGaN layers on InGaN rather than GaN, to form active regions of blue, green (and even yellow or red) LEDs and laser diodes. While InGaN films with an indium content up to about 20% could previously be grown on thick GaN, according to this invention, the indium content of the InGaN films is now extendible, for example to 50%, by growing such an InGaN film over an InGaN layer of about 30% indium, because this represents a similar magnitude of lattice mismatch.

The laser diode structure according to the invention described above can be applied to any device requiring compact laser structures, including high resolution laser printing devices, digital printers, display devices, projection displays, high density optical storage devices, including magneto-optical storage devices, including CD-ROM and DVD's whereby data is stored on a magneto-optical disk, fiber-optic communications devices, including for fiber optic emitters and repeaters and undersea communications devices (sea water is most transparent in the blue-green spectrum). The LED structure according to the invention can also be applied to any device requiring compact LED structures, including illumination devices and full color displays, including monolithically integrated pixels for full color displays.

Figure 6:
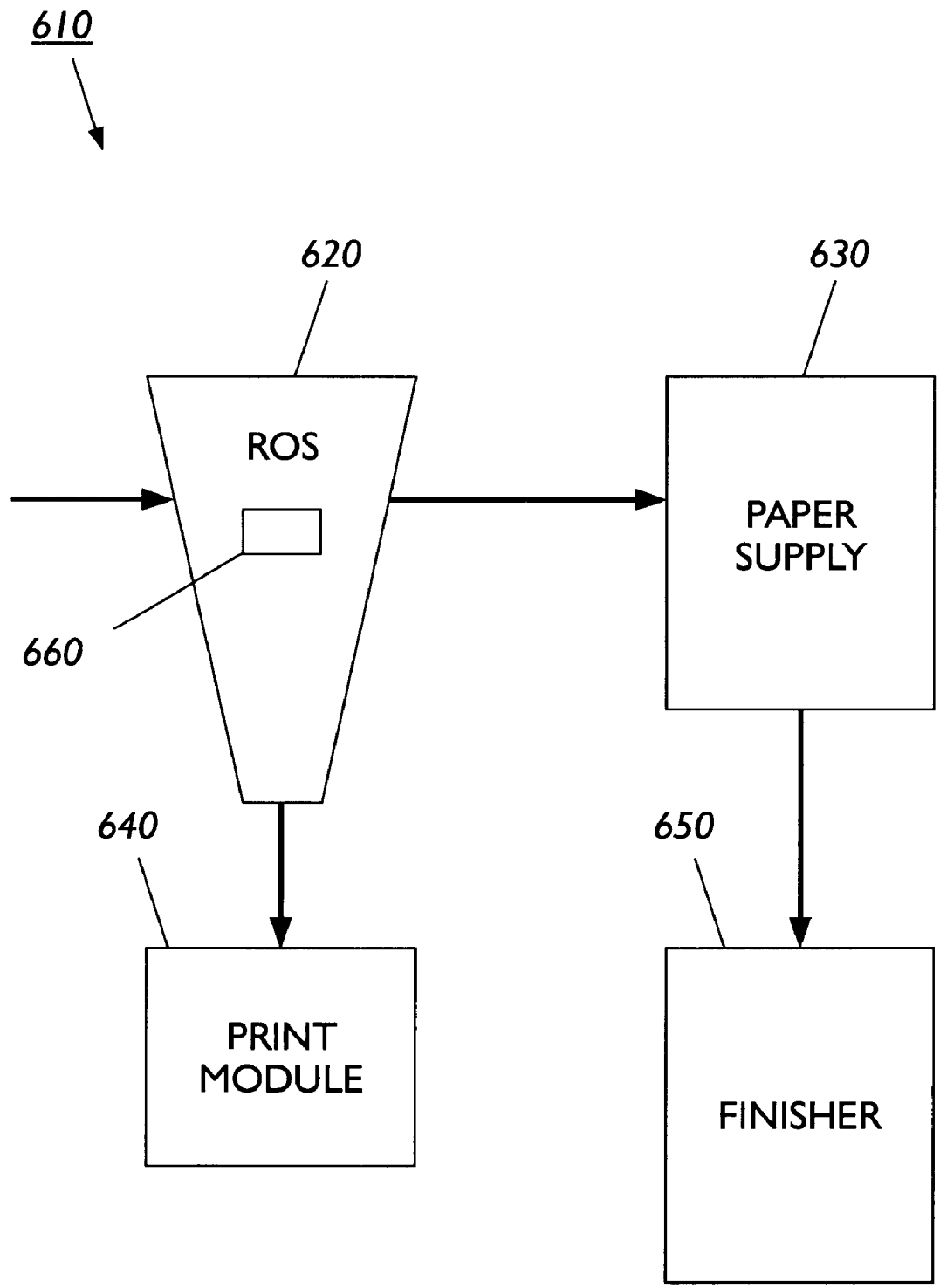
FIG. 6 shows the laser diode structure according to an embodiment of the invention incorporated into a reprographic printing system.

FIG. 6 shows the laser diode structures according to an embodiment of the invention implemented into a laser printing device. FIG. 6 shows a printer 610 which includes a raster output scanner (ROS) 620, a paper supply 630, a print module 640 and finisher 650. A laser diode structure 660 is incorporated into the ROS 620 for providing efficient scanning optics.

While the invention has been described in conjunction with specific embodiments as described above, it is evident that many alternatives, modifications, variations are apparent to those skilled in the art. Accordingly, the preferred embodiments of the invention as set forth above are intended to be illustrative and not limiting. Various changes can be made without departing from spirit and scope of the invention.

What is claimed is:

1. A semiconductor structure, comprising:

a nucleation layer;

a patterned mask layer formed on the nucleation layer;

an InGaN ELOG layer formed over the patterned mask layer;

a thick InGaN layer grown over the patterned mask layer; and an active layer formed over the thick InGaN layer.

2. The semiconductor structure according to claim 1, further comprising at least one group III–V nitride layer formed over the active layer.

3. The semiconductor structure according to claim 2, wherein the thick InGaN layer and the at least one group III–V nitride layer form confinement layers, confining injected carriers to the active layer.

4. The semiconductor structure according to claim 1, wherein the active layer includes a waveguiding layer and a quantum well active region.

5. The semiconductor structure according to claim 1, wherein the nucleation layer includes a plurality of nucleation sub-layers.

6. The semiconductor structure according to claim 1, wherein the active layer comprises InGaN.

7. The semiconductor structure according to claim 1, wherein the thick InGaN layer is n-type doped.

8. The semiconductor structure according to claim 1, wherein the semiconductor structure is an optoelectronic device.

9. The semiconductor structure according to claim 1, wherein the semiconductor structure emits light in the blue region of the spectrum.

10. The semiconductor structure according to claim 1, wherein the semiconductor structure emits light with a wavelength within a range including 430 nm to 650 nm.

11. The semiconductor structure according to claim 1, wherein the mask layer is a material selected from the group comprising SiN and $SiO_2$.

12. The semiconductor structure of claim 5, wherein the mask layer is a material selected from the group comprising SiN and $SiO_2$.

13. An image forming apparatus that forms an image on a light sensitive medium, the image forming apparatus including at least one light source that includes the semiconductor structure of claim 1.

14. A data storage apparatus that stores data on a medium, the data storage apparatus including at least one light source that includes the semiconductor structure of claim 1.

15. A communications apparatus that communicates information through a communications transmission medium, the communications apparatus including at least one light source that includes the semiconductor structure of claim 1.

16. The communications apparatus according to claim 15, wherein the communications apparatus comprises a fiber optic network.

17. The communications apparatus according to claim 15, wherein the at least one light source comprises at least one of a fiber optic emitter and a fiber optic repeater.

* * * * *

UNITED STATES PATENT AND TRADEMARK OFFICE
CERTIFICATE OF CORRECTION

PATENT NO. : 6,345,063 B1
DATED : February 5, 2002
INVENTOR(S) : David P. Bour et al.

It is certified that error appears in the above-identified patent and that said Letters Patent is hereby corrected as shown below:

<u>Column 1,</u>
Line 8, insert:
-- This invention was made with Government support under Agreement No. 70NANB2H1241 awarded by the Department of Commerce. The Government has certain rights in this invention. --.

Signed and Sealed this

Sixth Day of June, 2006

JON W. DUDAS
*Director of the United States Patent and Trademark Office*